United States Patent
Forejt

(10) Patent No.: US 6,943,717 B1
(45) Date of Patent: Sep. 13, 2005

(54) SIGMA DELTA CLASS D ARCHITECTURE WHICH CORRECTS FOR POWER SUPPLY, LOAD AND H-BRIDGE ERRORS

(75) Inventor: Brett E. Forejt, Plano, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 10/955,113

(22) Filed: Sep. 30, 2004

(51) Int. Cl.[7] .............................................. H03M 3/00
(52) U.S. Cl. ...................................................... 341/143
(58) Field of Search .............................. 341/143, 155, 341/120; 330/207 A, 75

(56) References Cited

U.S. PATENT DOCUMENTS

| | | | | |
|---|---|---|---|---|
| 5,030,952 A | * | 7/1991 | Ledzius et al. ............. | 341/143 |
| 5,392,040 A | * | 2/1995 | Hayashi ...................... | 341/143 |
| 5,392,282 A | * | 2/1995 | Kiema ......................... | 370/491 |
| 6,271,781 B1 | * | 8/2001 | Pellon ......................... | 341/143 |

* cited by examiner

*Primary Examiner*—Peguy JeanPierre
(74) *Attorney, Agent, or Firm*—Alan K. Stewart; W. James Brady, III; Frederick J. Telecky, Jr.

(57) ABSTRACT

A sigma delta class D device that uses a low pass filter to smooth the output waveform and eliminate high frequency switching noise from the feedback value includes: a first summing node having a positive input coupled to a signal input node; a second summing node having a first positive input coupled to an output of the first summing node and having an output coupled to a signal output node; a low pass filter having an input coupled to the output of the second summing node; an analog to digital converter having an input coupled to an output of the low pass filter; a third summing node having a positive input node coupled to an output of the analog to digital converter and a negative input node coupled to the output of the first summing node; and a feedback device coupled between an output of the third summing node and a negative input of the first summing node.

4 Claims, 1 Drawing Sheet

SIGMA DELTA CLASS D ARCHITECTURE WHICH CORRECTS FOR POWER SUPPLY, LOAD AND H-BRIDGE ERRORS

FIELD OF THE INVENTION

The present invention relates to electronic circuitry and, in particular, to a sigma delta class D architecture which corrects for power supply, load, and H-bridge errors.

BACKGROUND OF THE INVENTION

Typically Class D architectures employ multiple feedback loops in order to attain all performance goals in the system. Primarily power supply rejection ratio (PSRR) and distortion are the most difficult issues to surmount. Since an ideal Class D amp has zero output impedance and switches the load terminal between ground and the power supply, it has no power supply rejection. Class D outputs are also susceptible to errors introduced by non-ideal, non-symmetric H-bridge switching.

SUMMARY OF THE INVENTION

A sigma delta class D device that uses a low pass filter to smooth the output waveform and eliminate high frequency switching noise from the feedback value includes: a first summing node having a positive input coupled to a signal input node; a second summing node having a first positive input coupled to an output of the first summing node and having an output coupled to a signal output node; a low pass filter having an input coupled to the output of the second summing node; an analog to digital converter having an input coupled to an output of the low pass filter; a third summing node having a positive input node coupled to an output of the analog to digital converter and a negative input node coupled to the output of the first summing node; and a feedback device coupled between an output of the third summing node and a negative input of the first summing node.

DETAILED DESCRIPTION OF PREFERRED EMBODIMENTS

The circuit according to the present invention employs a feedback structure which will correct for all such errors and eliminate the need for separate power supply and H-bridge feedback loops. The circuit structure has the added advantage of eliminating the digital to analog (D2A) converter typically used in audio codec receive (D2A) channels since its input is a direct digital word.

Figure 1:
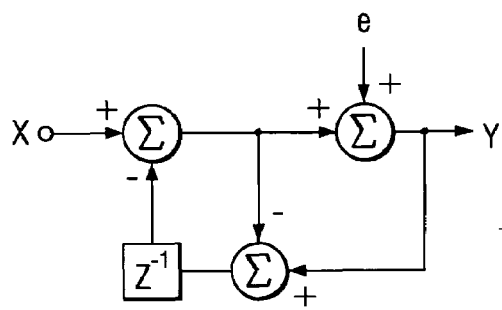
FIG. 1 is a diagram of a prior art digital implementation of a first order sigma delta modulator.

A typical prior art digital implementation of a first order sigma delta modulator is shown in FIG. 1. The device of FIG. 1 includes summing nodes 20, 22, and 24; feedback 26; input X; and output Y. This is the "error feedback" form which has minimal and straight forward digital implementation.

Figure 2:
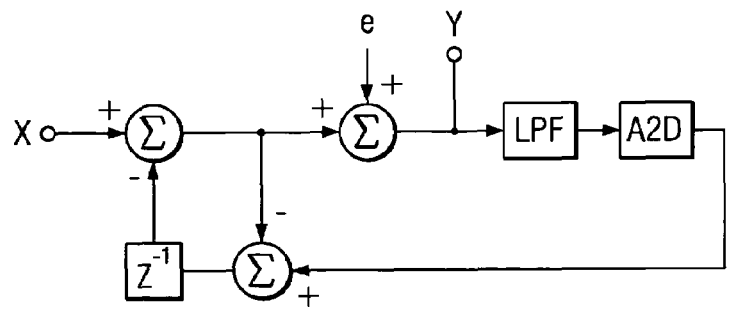
FIG. 2 is a diagram of a first order sigma delta modulator with a simple first order low pass filter and an analog to digital converter, according to the present invention.

A system, according to the present invention, with the addition of two analog blocks: a simple first order low pass filter LPF and an analog to digital converter A2D, is shown in FIG. 2.

In FIGS. 1 and 2, X denotes the input, Y the output, and e is the quantization error of the comparator/quantizer.

The low pass filter LPF is added to smooth the output waveform and eliminate the high frequency switching noise from the feedback value. This is appropriate since the original system was all digital. No information should be lost in the band of interest if the cut-off frequency of the low pass filter LPF is greater than the signal bandwidth. The resulting signal will include all system errors. In particular, power supply induced errors and distortion related to non-ideal H-bridge switching should be present and unaffected inside the signal bandwidth.

The purpose of the analog to digital converter A2D is to convert the signal which includes all sources of error and distortion into a digital word representation that can be fed back into the system. Simulations of the first order system prove functionality.

Figure 3:
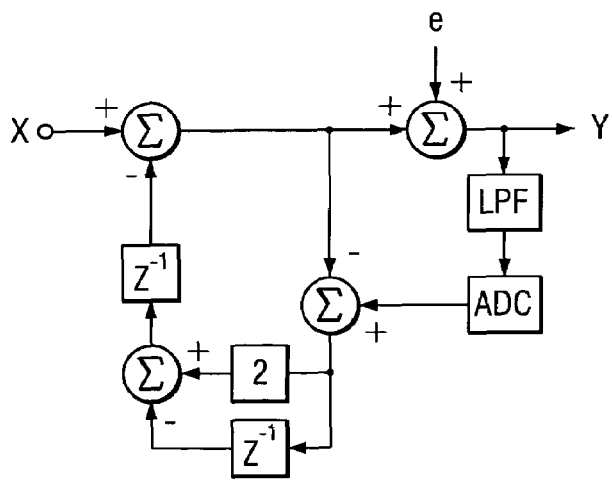
FIG. 3 is a diagram of a second order sigma delta modulator with a simple first order low pass filter and an analog to digital converter, according to the present invention.

Although the theory is sound and simulations prove functionality, the performance of the first order system is lacking. Therefore, the theory must be extended to the second order case. FIG. 3 depicts the direct interpretation of the theory on the second order error feedback architecture. FIG. 3 includes summing nodes 40, 42, 44, and 46; low pass filter LPF; analog to digital converter ADC; gain stage 48 with a gain of 2; feedback functions 50 and 52. This form is not inherently stable as with the first order structure.

Figure 4:
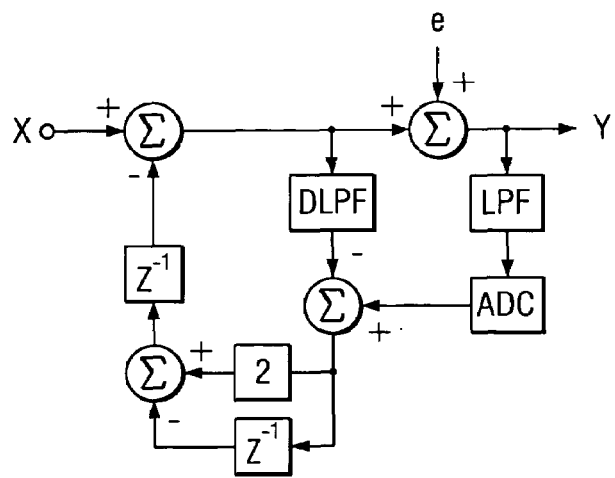
FIG. 4 is a diagram of a modified second order sigma delta modulator that matches feed forward and feedback paths, according to the present invention.

FIG. 4 shows the circuit with a modification that improves the stability by matching the feed forward and feedback paths so that the signal at node G(z) is again approximately equal to the quantization error e. FIG. 4 is similar to FIG. 3 with the addition of the digital low pass filter DLPF.

Since the pole frequency variation of the digital low pass filter DLPF does not vary with process and the analog low pass filter LPF can vary up to +/−30% there is concern for robustness over process variation. Simulations show the architecture to be stable across a wide range of low pass filter LPF pole frequencies.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A sigma delta class D device comprising:
   a first summing node having a positive input coupled to a signal input node;
   a second summing node having a first positive input coupled to an output of the first summing node and having an output coupled to a signal output node;
   a low pass filter having an input coupled to the output of the second summing node;
   an analog to digital converter having an input coupled to an output of the low pass filter;

a third summing node having a positive input node coupled to an output of the analog to digital converter and a negative input node coupled to the output of the first summing node; and a feedback device coupled between an output of the third summing node and a negative input of the first summing node.

2. The device of claim 1 further comprising a quantization error node coupled to a second positive input of the second summing node.

3. A sigma delta class D device comprising:

a first summing node having a positive input coupled to a signal input node;

a second summing node having a first positive input coupled to an output of the first summing node and having an output coupled to a signal output node;

a low pass filter having an input coupled to the output of the second summing node;

an analog to digital converter having an input coupled to an output of the low pass filter;

a third summing node having a positive input node coupled to an output of the analog to digital converter and a negative input node coupled to the output of the first summing node;

a fourth summing node;

a first feedback device coupled between an output of the third summing node and a negative input of the fourth summing node;

a gain stage coupled between the output of the third summing node and a positive input of the fourth summing node; and a second feedback device coupled between an output of the fourth summing node and a negative input of the first summing node.

4. The device of claim 3 further comprising a digital low pass filter coupled between the output of the first summing node and the negative input of the third summing node.

* * * * *